United States Patent [19]
Oikawa

[11] Patent Number: 5,264,737
[45] Date of Patent: Nov. 23, 1993

[54] ONE-SHOT SIGNAL GENERATION CIRCUITRY FOR USE IN SEMICONDUCTOR MEMORY INTEGRATED CIRCUIT

[75] Inventor: Takeshi Oikawa, Kawasaki, Japan

[73] Assignee: NEC Corporation, Tokyo, Japan

[21] Appl. No.: 925,121

[22] Filed: Aug. 6, 1992

[30] Foreign Application Priority Data

Aug. 6, 1991 [JP] Japan ................... 3-195644

[51] Int. Cl.$^5$ .............................. H03K 3/86
[52] U.S. Cl. ................... 307/265; 365/233.5; 365/233
[58] Field of Search ............ 365/233.5, 233; 307/265, 234, 268, 260

[56] References Cited

U.S. PATENT DOCUMENTS 4,636,991  1/1987  Flannagan et al. ............ 365/233.5
4,710,904  12/1987  Suzuki ......................... 365/233.5

FOREIGN PATENT DOCUMENTS 0179979  11/1982  Japan ................... 365/233
0066215   4/1984  Japan ................... 307/265
0221891  12/1984  Japan ................... 365/233.5

*Primary Examiner*—Eugene R. LaRoche
*Assistant Examiner*—Son Mai
*Attorney, Agent, or Firm*—Foley & Lardner

[57] ABSTRACT

An OS signal generation circuitry comprises a plurality of OS signal generating circuits receiving corresponding address bits of an address so as to generate individual OS signals, respectively, which are supplied to an OR circuit for generating an original OS signal. This original OS signal is supplied to a rising detection circuit, which outputs a second OS signal generated on the basis of the detected rising of the original OS signal and having a substantially constant width. Another OR circuit receives the original OS signal and the second OS signal and generates an output OS signal having the constant OS width. Accordingly, the OS signal can have the OS width which does not vary dependently upon the number of address bits actually changing their logical level.

3 Claims, 4 Drawing Sheets

ONE-SHOT SIGNAL GENERATION CIRCUITRY FOR USE IN SEMICONDUCTOR MEMORY INTEGRATED CIRCUIT

BACKGROUND OF THE INVENTION

1. Field of the Invention

The present invention relates to a semiconductor integrated circuit, and more specifically to a one-shot pulse signal generation circuitry for use in a semiconductor memory integrated circuit. In this specification, the one-shot pulse signal will be called an "OS signal".

2. Description of Related Art

A typical example of conventional OS signal generation circuitry for use in a semiconductor memory integrated circuit comprises "n" external address inputs $A_1$ to $A_n$ (where "n" is positive integer) for receiving an address of "n" bits, and the same number of OS signal generating circuits each having an input connected to a corresponding one of the external address inputs and generating an individual OS signal in response to a logical level transition of a corresponding address bit. An output of all the individual OS signal generating circuits is connected to inputs of an OR circuit, which generates an output OS signal.

In this conventional OS signal generation circuitry, a P/N ratio in each logic circuit receiving one corresponding address bit substantially changes dependently upon whether the address of "n" bits changes in only one bit or in a plurality of bits, namely in accordance with the number of address bits actually changing their logical level. Here, the P/N ratio can be defined to mean a ratio of a current driving capacity of a turned-on P-channel transistor to a current driving capacity of a turned-on N-channel transistor in a MOS transistor circuit.

Because of the change of the P/N ratio, a logical threshold voltage level in each logic circuit correspondingly changes. As a result, a one-shot pulse width of the output OS signal changes dependently upon the number of address bits actually changing their logical level. In a semiconductor memory circuit in which an internal operation is controlled by the output OS signal, an access time is dependent upon the timing of the rising of the OS signal and the pulse width of the OS signal. Here, the access time can be defined to mean a length of time from the moment an address is established to the moment an output data becomes effective. Therefore, the access time depends upon which of the "n" address bits actually changes and upon the number of address bits actually changing their logical level. Namely, the access time has a dependency to the address.

SUMMARY OF THE INVENTION

Accordingly, it is an object of the present invention to provide an OS signal generation circuitry which has overcome the above mentioned defect of the conventional one.

Another object of the present invention is to provide an OS signal generation circuitry capable of generating an output OS signal having a constant OS width without being influenced by the number of address bits actually changing their logical level.

The above and other objects of the present invention are achieved in accordance with the present invention by an OS signal generation circuitry for use in a semiconductor integrated circuit, comprising:

a plurality of external address inputs for receiving an address composed of a corresponding number of bits;

a corresponding number of OS signal generating circuits each having an input connected to a corresponding one of the external address inputs and generating an individual OS signal in response to a logical level transition of a corresponding address bit;

a first logic circuit, receiving all the individual OS signals respectively generated from the OS signal generating circuits, for generating a first common OS signal formed of a logical sum of the received individual OS signals;

a second logic circuit, receiving the first common OS signal, for detecting a rising of the received first common OS signal so as to generate a second common OS signal having a constant width; and a third logic circuit, receiving the first common OS signal and the second common OS signal, for generating an output OS signal formed of a logical sum of the received first and second common OS signals.

The second logic circuit can be constituted of an odd number of cascaded inverters, an input of a first inverter of the odd number of cascaded inverters being connected to receive the first common OS signal; and an AND circuit having a first input connected to an output of an even-numbered inverter of the odd number of cascaded inverters, a second input of the AND circuit being connected to an output of the final inverter of the odd number of cascaded inverters, and an output of the AND circuit generating the second common OS signal.

In a preferred embodiment, the second logic circuit includes first to fifth cascaded inverters, an input of the first inverter being connected to receive the first common OS signal; a NAND circuit having a first input connected to an output of the second inverter and a second input connected to an output of the fifth inverter, and a sixth inverter having an input connected to an output of the NAND circuit and an output generating the second common OS signal.

The above and other objects, features and advantages of the present invention will be apparent from the following description of a preferred embodiment of the invention with reference to the accompanying drawings.

DESCRIPTION OF THE PREFERRED EMBODIMENTS

Figure 1:
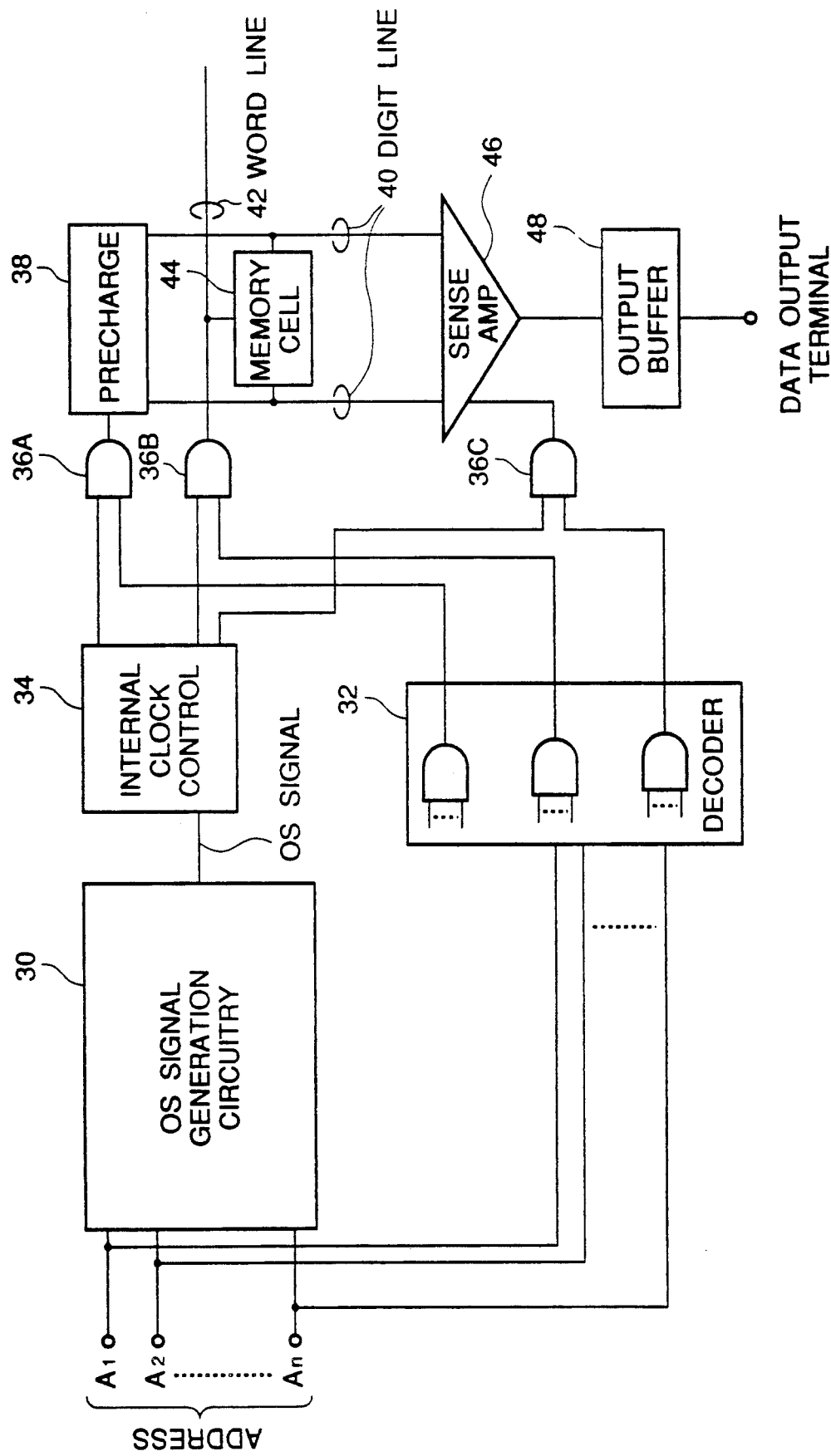
FIG. 1 is a block diagram of a semiconductor memory circuit in which the OS signal generation circuitry in accordance with the present invention can be incorporated.

Referring to FIG. 1, there is shown a block diagram of a semiconductor memory circuit in which the OS signal generation circuitry in accordance with the present invention can be incorporated.

Respective address bits $A_1$ to $A_n$ of an "n"-bit address (where "n" is a positive integer larger than 1) are supplied to an OS signal generation circuitry 30 and an address decoder 32. The OS signal generation circuitry 30 generates an OS signal to an internal clock control circuit 34, which generates various timing signals. The address decoder 32 generates decoded address signals. One of the various timing signals and one of the decoded address signals are supplied through an AND gate 36A to a precharge circuit 38, which operates to precharge a pair of associated digit lines 40. Another of the various timing signals and another of the decoded address signals are supplied through an AND gate 36B so as to drive an associated word line 42. A memory cell 44 is connected to one pair of digit lines 40 and one word line 42, and in addition, one sense amplifier 46 is connected to one pair of digit lines 40. The sense amplifier 46 is controlled by an output of an AND gate 36C receiving one of the various timing signals and one of the decoded address signals. An output of the sense amplifier 46 is connected to an input of an output buffer 48, which in turn has an output connected to an data output terminal.

It would be apparent to persons skilled in the art that only one precharge circuit, one word line, one pair of digit lines, one sense amplifier and one output buffer are shown in FIG. 1 for simplification of drawing, but an actual semiconductor memory circuit comprises a number of precharge circuits, a number of word lines, a number of pair of digit lines, a number of sense amplifiers, and a number of output buffers.

Figure 1A:
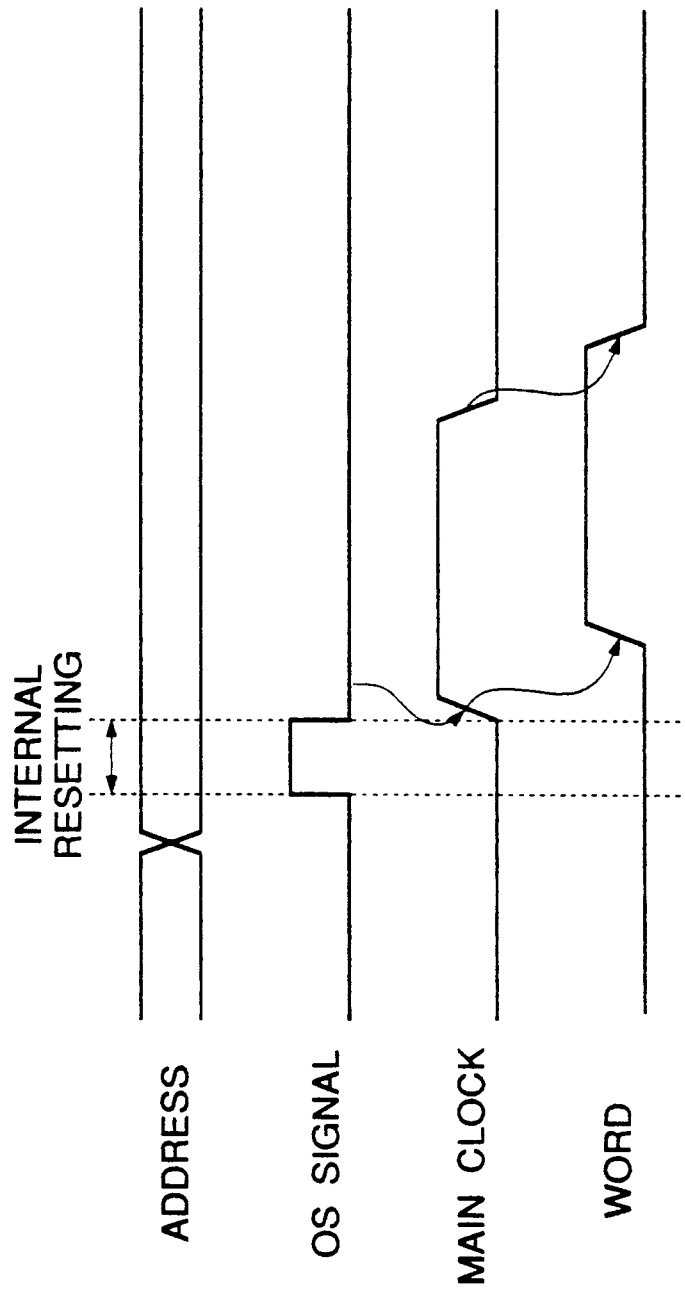
FIG. 1A is a timing chart illustrating a relation between the OS signal and a main clock in the semiconductor memory circuit shown in FIG. 1.

Referring to FIG. 1A, in response to transition of the received address A1 to An, the OS signal generation circuitry 30 generates the OS signal having a substantial pulse width, and the internal clock control circuit 34 resets the internal condition of the memory circuit in response to the OS signal. As a typical example of the internal condition resetting, the internal clock control circuit 34 causes the precharge circuit 38 to precharge the associated digit lines 40 during the period of the OS signal. After the OS signal falls down, a main clock (not shown in FIG. 1) generated by the internal clock control circuit 34 or under the control of the internal clock control circuit 34 rises up, and thereafter, the word line 42 is activated.

As seen from the above, the OS signal is very important to the operation of the semiconductor memory integrated circuit, and the OS signal generation circuitry is used for controlling the internal circuit in synchronism with the transition of the address.

Figure 2:
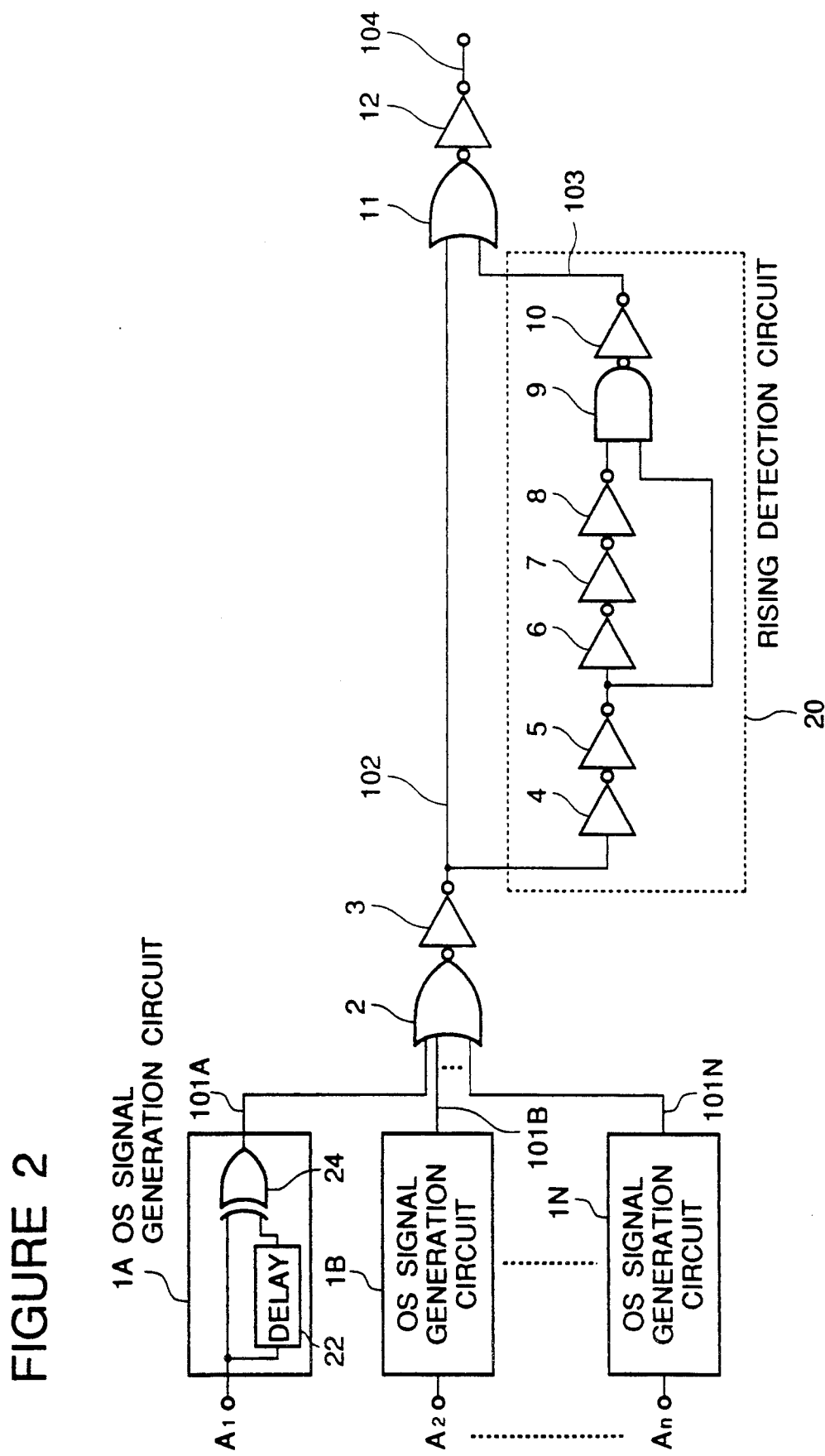
FIG. 2 is a logic diagram of an embodiment of the OS signal generation circuitry in accordance with the present invention.

Referring to FIG. 2, there is shown a logic diagram of an embodiment of the OS signal generation circuitry in accordance with the present invention.

The shown OS signal generation circuitry comprises a plurality of external address inputs for receiving an address composed of a corresponding number of address bits A1 to An, and a corresponding number of OS signal generating circuits 1A to 1N (where "N" corresponds to "n") each having an input connected to a corresponding one of the external address inputs so as to receive a corresponding address bit Ai ("i" is 1 to "n"). Each of OS signal generating circuits 1A to 1N generates an individual OS signal 101 (101A to 101N) in response to a logical level transition of a corresponding address bit Ai.

As shown in the inside of the block 1A, each of the OS signal generating circuits 1A to 1N comprises a delay line 22 having an input connected to a corresponding address bit Ai, and an exclusive OR gate 24 having a first input connected to an output of the delay line 22 and a second input connected to the corresponding address bit Ai. Thus, the exclusive OR gate 24 produces an exclusive OR between the corresponding address bit Ai and the delayed signal of the corresponding address bit Ai. Therefore, when the corresponding address bit Ai changes its logical level, the exclusive OR gate 24 generates a one-shot pulse which rises up in synchronism with the transition of the address bit Ai and which has a pulse width corresponding to a delay time of the delay line 22. Therefore, the OS signal generating circuits 1A to 1N detects the address transition so as to generate a pulse in synchronism with the address transition. Accordingly, the OS signal generating circuits can be called an "address transition detector".

An output of all the OS signal generating circuits 1A to 1N are connected to a NOR gate 2, which in turn has an output connected to an inverter 3. Therefore, the NOR gate 2 and the inverter 3 constitute an OR circuit. Thus, the inverter 3 generates a first common OS signal 102 formed of a logical sum of the individual OS signals 101A to 101N.

The first common OS signal 102 is connected to an OS signal rising detection and pulse generation circuit 20, which includes first to fifth cascaded inverters 4, 5, 6, 7 and 8. An input of the first inverter 4 is connected to an output of the inverter 3, and an output of the second inverter 5 is connected to a first input of a NAND gate 9. A second input of the NAND gate 9 is connected to an output of the fifth inverter 8, and an output of the NAND gate 9 is connected to an inverter 10. Therefore, an AND circuit is formed of the NAND gate 9 and the inverter 10. In this arrangement, an output of the inverter 10 generates a second common OS signal 103 which rises up in synchronism with a rising of the output of the second inverter 5 and which falls down in synchronism with a falling of the output of the fifth inverter 8. Namely, the second common OS signal 103 has a constant pulse width corresponding to a total delay time of the cascaded inverters 6, 7 and 8. Accordingly, the cascaded inverters 6, 7 and 8 are designed to give a substantial delay.

With the above logical arrangement, the rising of the first common OS signal 102 is detected, and the inverter 10 generates the second common OS signal 103 generated on the basis of the detected rising of the first common OS signal 102 and having a constant width.

The output of the inverter 10 is connected to one input of a NOR gate 11, which has its other input connected to the output of the inverter 3. An output of the NOR gate 11 is connected to an input of an inverter 12, which has an output for generating an output OS signal 104. Therefore, an OR circuit is formed of the NOR gate 11 and the inverter 12.

Figure 3:
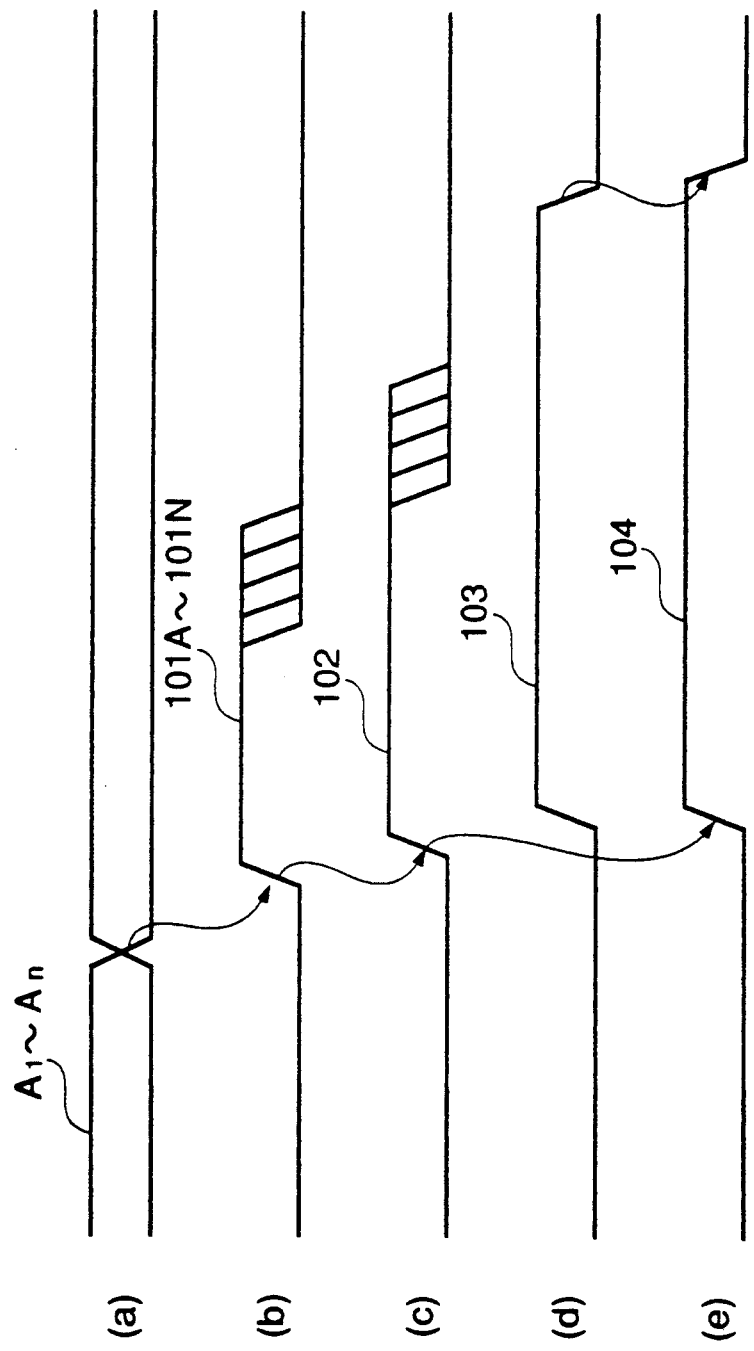
FIG. 3 is a timing chart illustrating an operation of the OS signal generation circuitry shown in FIG. 2.

As shown in FIG. 3, each of the OS signal generating circuits 1A to 1N generates the individual OS signal in response to the change of the logical level of the corresponding address bits, and all the individual OS signals 101A to 101N generated by the OS signal generating circuits 1A to 1N are unified into one common OS signal 102 by action of the NOR gate 2 and the inverter 3. As mentioned hereinbefore, dependently upon whether the "n"-bit address changes in only one bit or in a plurality of bits, namely in accordance with the number of address bits actually changing their logical level, the individual OS signals 101A to 101N generated by the OS signal generating circuits 1A to 1N may have different pulse widths. Therefore, the common OS signal 102 has a pulse width varying dependently upon the number of address bits actually changing their logical level.

Here, as shown in FIG. 3, the OS signal rising detection and pulse generation circuit 20 is configured so that the signal 103 has a sufficient wide fixed pulse width inherently required for the OS signal. On the other hand, the signal 102 is set to have a width shorter than that of the signal 103 in ordinary cases.

With the above mentioned arrangement, even if the width of the signal 102 will vary dependently upon the number of address bits actually changing their logical level, since the output OS signal 104 is a logical sum of the signal 102 and the signal 103, the width of the output OS signal 104 is determined by the width of the signal 103. In other words, the output OS signal 104, which controls the internal circuit of the semiconductor memory circuit, can has a substantially constant width. Therefore, the address dependency of the access time attributable to the OS signal outputted from the OS signal generation circuit will not occur.

On the other hand, if an address queue is provided so that the OS width of the signal 102 is remarkably increased and therefore is larger than that of the signal 103, the output OS signal 104 can become independent of the OS width of the signal 103, and therefore, will not give an adverse effect to the internal operation.

As seen from the above, the OS signal generation circuitry in accordance with the present invention is characterized in that a second OS signal having a constant width is generated by detecting the rising of an original OS signal, and then, the output OS signal is generated by a logical sum of the original OS signal and the second OS signal. Therefore, the width of the OS signal for controlling the internal circuit is prevented from varying dependently upon the number of address bits actually changing their logical level.

The invention has thus been shown and described with reference to the specific embodiments. However, it should be noted that the present invention is in no way limited to the details of the illustrated structures but changes and modifications may be made within the scope of the appended claims.

I claim:

1. An OS signal generation circuitry for use in a semiconductor integrated circuit, comprising:

a plurality of external address inputs for receiving an address composed of a corresponding number of bits;

a corresponding number of OS signal generating circuits each having an input connected to a corresponding one of said external address inputs and generating an individual OS signal in response to a logical level transition of a corresponding address bit;

a first logic circuit, receiving all the individual OS signals respectively generated from said OS signal generating circuits, for generating a first common OS signal formed of a logical sum of the received individual OS signals;

a second logic circuit, receiving said first common OS signal, for detecting a rising of the received first common OS signal so as to generate a second common OS signal having a constant width; and a third logic circuit, receiving said first common OS signal and said second common OS signal, for generating an output OS signal formed of a logical sum of the received first and second common OS signals.

2. An OS signal generation circuitry claimed in claim 1 wherein said second logic circuit includes an odd number of cascaded inverters, an input of a first inverter of said odd number of cascaded inverters being connected to receive said first common OS signal; and an AND circuit having a first input connected to an output of an even-numbered inverter of said odd number of cascaded inverters, a second input of said AND circuit being connected to an output of said final inverter of said odd number of cascaded inverters, and an output of said AND circuit generating said second common OS signal.

3. An OS signal generation circuitry claimed in claim 1 wherein said second logic circuit includes first to fifth cascaded inverters, an input of the first inverter being connected to receive said first common OS signal; a NAND circuit having a first input connected to an output of the second inverter and a second input connected to an output of the fifth inverter, and a sixth inverter having an input connected to an output of said NAND circuit and an output generating said second common OS signal.

* * * * *